(12) United States Patent
Woodard

(10) Patent No.: US 6,944,729 B2
(45) Date of Patent: Sep. 13, 2005

(54) MULTIPLEXING-INTERLEAVING AND DEMULTIPLEXING-DEINTERLEAVING

(75) Inventor: Jason Paul Woodard, Cambridge (GB)

(73) Assignee: Ubinetics Limited (GB)

( * ) Notice: Subject to any disclaimer, the term of this patent is extended or adjusted under 35 U.S.C. 154(b) by 207 days.

(21) Appl. No.: 10/258,681
(22) PCT Filed: Apr. 24, 2001
(86) PCT No.: PCT/GB01/01818
§ 371 (c)(1),
(2), (4) Date: Oct. 25, 2002
(87) PCT Pub. No.: WO01/82489
PCT Pub. Date: Nov. 1, 2001

(65) Prior Publication Data
US 2003/0128722 A1 Jul. 10, 2003

(30) Foreign Application Priority Data
Apr. 25, 2000 (GB) .............................. 0010079

(51) Int. Cl.$^7$ .............................. H04J 3/06; G06F 12/02
(52) U.S. Cl. ..................... 711/158; 711/154; 711/157
(58) Field of Search ................................ 711/154, 211, 711/158, 157; 370/574; 375/340; 714/702

(56) References Cited

U.S. PATENT DOCUMENTS

| | | | | |
|---|---|---|---|---|
| 617,530 A | * | 1/1899 | Aman et al. ................. | 714/702 |
| 4,291,406 A | | 9/1981 | Bahl et al. | |
| 6,112,012 A | | 8/2000 | Fujinami | |
| 6,618,450 B1 | * | 9/2003 | Hatta ......................... | 375/340 |
| 6,771,671 B1 | * | 8/2004 | Fields et al. ................ | 370/514 |

FOREIGN PATENT DOCUMENTS

| | | |
|---|---|---|
| CN | 1148237 | 4/1997 |
| EP | 0 757 491 | 2/1997 |
| GB | 2 346 782 A | 8/2000 |
| WO | WO 98/59473 | 12/1998 |
| WO | WO 00/10348 | 2/2000 |

OTHER PUBLICATIONS

M. Kurisu, M. Kaneko, T. Suzaki, A. Tanabe, M. Togo, A. Furukawa, T. Tamura, K. Nakajima and K. Yoshida, "2.8–Gb/s 176–mW Byte–Interleaved and 3.0–Gb/s 118–mW Bit–Interleaved 8:1 Multiplexers with a 0.15–$\mu$m CMOS Technology", *IEEE Journal of Solid–State Circuits*, vol. 31, No. 12, Dec. 1996, pp. 2024–2029.

J. Kalliokuljo, et al, "User Plane Architecture of $3^{rd}$ Generation Mobile Telecommunication Network", Proceedings of the IEEE International Conference on Networks (ICON–99), Brisbane (Australia), Sep. $28^{th}$ to Oct. $1^{st}$, 1999, pp. 270–278.

* cited by examiner

Primary Examiner—Than Nguyen
(74) Attorney, Agent, or Firm—Banner & Witcoff, Ltd.

(57) ABSTRACT

The processor (24) retrieves from a memory (22) values of a signal recovered from received wireless signal and demultiplexes and de-interleaves them simultaneously. The system can be operated in reverse to produce a multiplexed, interleaved data stream for wireless transmission.

9 Claims, 2 Drawing Sheets

MULTIPLEXING-INTERLEAVING AND DEMULTIPLEXING-DEINTERLEAVING

Figure 1:
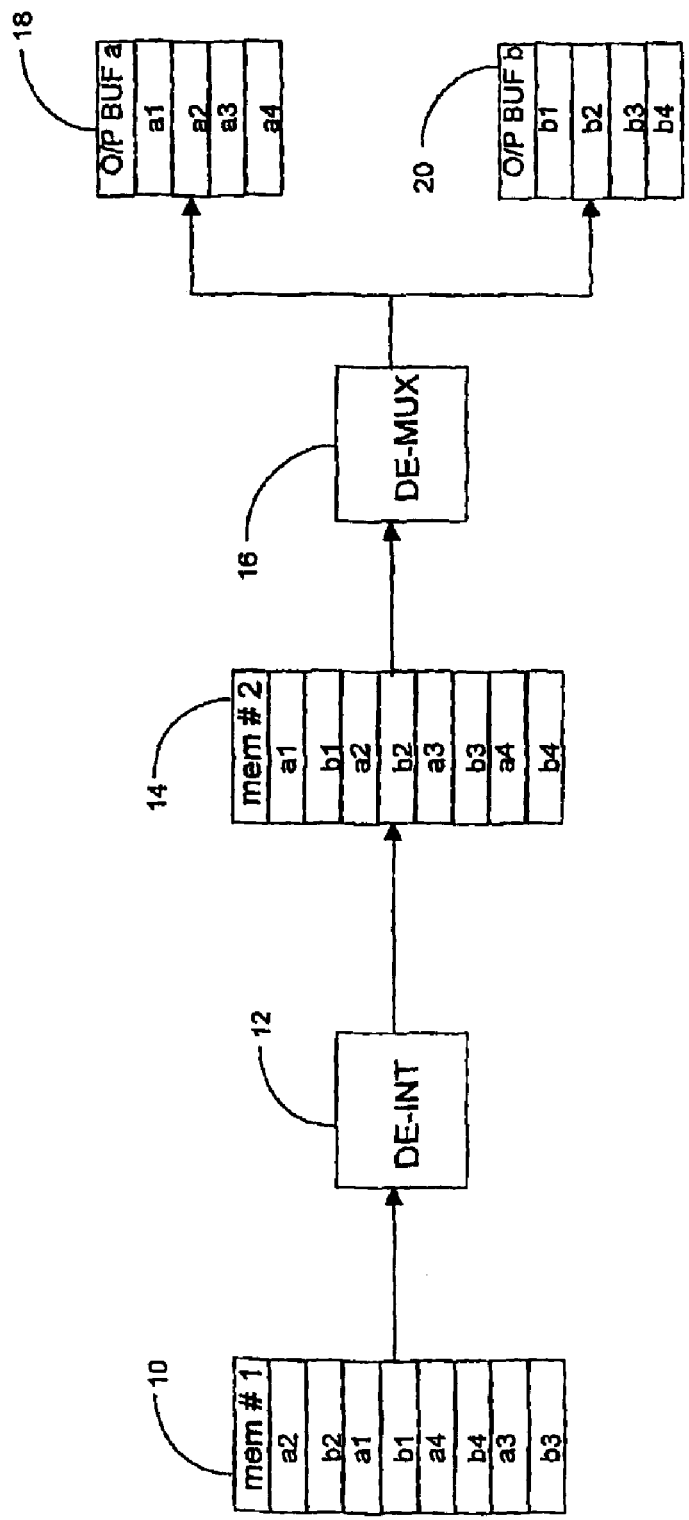

This invention relates to methods and apparatus for reordering data and separating or combining data streams.

At a digital communications transmitter, bits produced by a channel encoder are reordered (or interleaved) to increase their resistance to correlated channel imperfections (noise, fading etc.). At the receiver, this reordering must be reversed using a de-interleaver before channel decoding can take place. After de-interleaving in the receiver, the bits are often de-multiplexed which means that the de-interleaved bits are split into several smaller sets of bits which are used separately.

For example, in the system described in "3G TS 25 212 v 3.0.0 third generation partnership project (3GPP); technical specification group radio access network multiplexing and channel coding (FDD)", a turbo encoder produces bits which are then interleaved. At the receiver, the bits are de-interleaved before being passed to the turbo decoder. The turbo decoder needs to de-multiplex its input to produce three distinct sets of inputs: One is the received systematic soft decisions (labelled $S(0,1, \ldots )$), another is the parity information from one component encoder (labelled $P_1(0,1, \ldots )$), and the third is the parity information from the other component encoder (labelled $P_2(0,1, \ldots )$). These bits are output by the transmitter multiplexer in the order $S(0)$, $P_1(0)$, $P_2(0)$, $S(1)$, $P_1(1)$, $P_2(1)$.

In the conventional receiver system, the received data stream is input to a first memory area and then rewritten to a second memory area by a de-interleaver in the de-interleaved order. A de-multiplexer then writes the de-interleaved data into separate output buffers for each of the separate data streams forming part of the received signal. This process is memory intensive in terms of both the amount of memory required and the time taken to perform the memory access operations.

It is an object of the invention to provide for more efficient de-interleaving-demultiplexing and/or multiplexing-interleaving of data.

According to a first aspect, the invention provides a method of recovering separate data streams from a composite data stream with the data within each separate recovered stream reordered compared with the composite stream, said method comprising applying a single transformation to each data item in the composite data stream to assign it to its correct position in the appropriate one of the recovered data streams.

The invention also extends to a program for performing the above method.

According to a second aspect, the invention provides apparatus for recovering separate data streams from a composite data stream with the data within each separate recovered stream reordered compared with the composite stream, said apparatus comprising means for applying a single transformation to each data item in the composite data stream to assign it to its correct position in the appropriate one of the recovered separate data streams.

According to a third aspect, the invention provides a method of producing a composite data stream from separate data streams with the data within the composite stream being reordered compared to the separate streams, said method comprising applying to each data item in each of the separate data streams a single transformation to assign it to its appropriate position in the composite data stream.

The invention also extends to a program for performing the above method.

According to a fourth aspect, the invention provides apparatus for producing a composite data stream from separate data streams with the data within the composite stream being reordered compared to the separate streams, said apparatus comprising means for applying to each data item in each of the separate data streams a single transformation to assign it to its appropriate position in the composite data stream.

The invention, by combining the reordering and separation/combination operations achieves a saving of processing time and also a saving of memory usage (in terms of silicon real estate and time spent accessing the memory).

In a preferred embodiment, the reordering operation is an interleaving or a de-interleaving algorithm.

Preferably, the data items in the recovered data streams are soft decisions (tentatively identified data).

In the preferred embodiment, the separate data streams are a stream of systematic data (S) and two streams of parity information from two component encoders ($P_1$, $P_2$), such as may be produced by a 3GPP turbo encoder.

Figure 2:
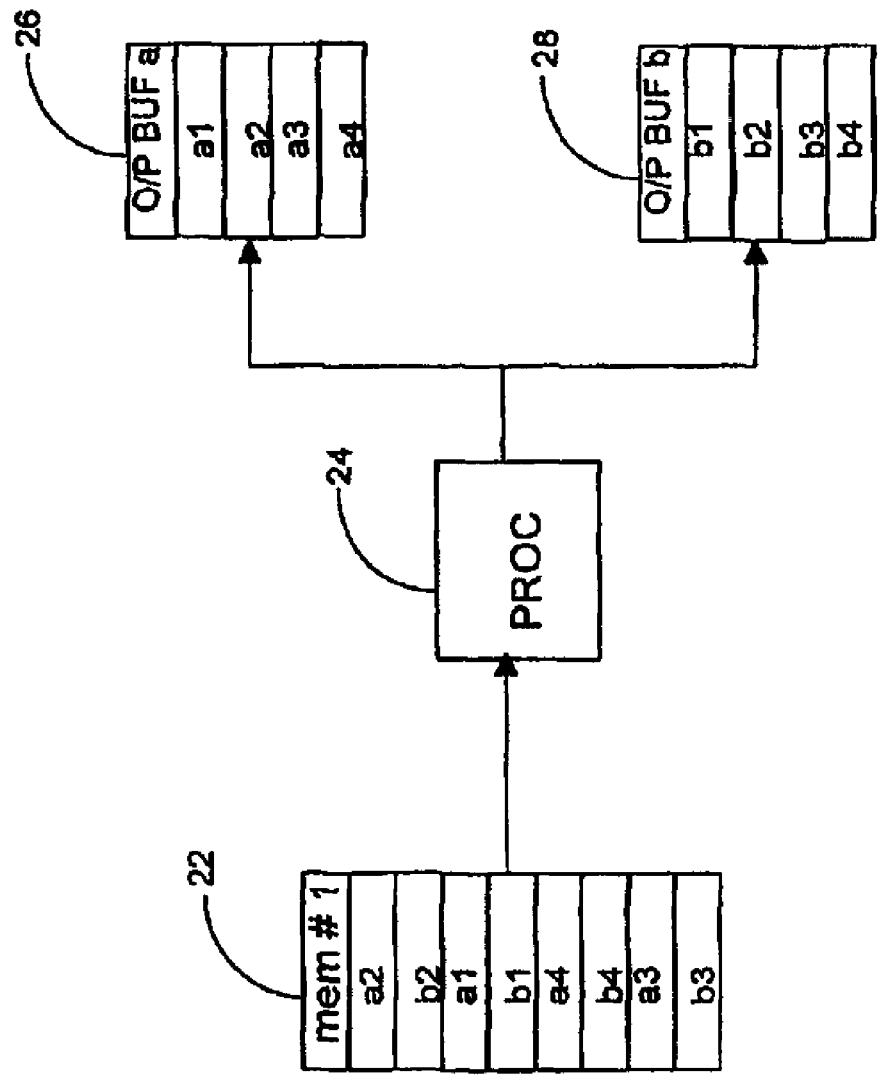

By way of example only, an embodiment of the invention will now be described with reference to the accompanying figures, in which:

FIG. 1 illustrates schematically prior art processing circuitry in a receiver; and FIG. 2 illustrates schematically processing circuitry in a receiver according to the invention.

In the example of FIG. 1, the receiver receives a data stream which is an interleaved version of a composite signal created by multiplexing two data streams a and b. Data stream a contains consecutive data items a1, a2, a3, a4 . . . and data stream b contains data items b1, b2, b3, b4 . . . .

In the prior art receiver circuitry of FIG. 1, the received data stream is buffered in a first memory 10 as a series of bits (or soft decisions) a2, b2, a1, b1, a4, b4, a3, b3. De-interleaver 12 operates on the list of bits in memory 10 to cancel the action of the interleaver operating in the transmitter which sent the data stream. The de-interleaver 12 writes the bits from memory 10 into a second memory 14 in the de-interleaved order: a1, b2, a2, b2, a3, b3, a4, b4. De-multiplexer 16 then operates on the de-interleaved data in memory 14 to provide de-multiplexed data streams a and b to respective output buffers 18 and 20. The de-multiplexed data streams in buffers 18 and 20 are then used by the receiver in further processing operations as desired.

In the circuitry of FIG. 2, the receiver receives the same interleaved multiplexed data stream as in FIG. 1. This data stream is stored into memory 22. A processor 24 is arranged to read the data items from memory 22 and perform both the de-interleaving and de-multiplexing operations at the same time using a single transformation. For example, upon reading the first entry (a2) in memory 22, the processor 24 immediately writes this data item to the second position in output buffer 26 for data stream a. Upon reading the last item (b3) in memory 22, processor 24 writes it to the third position in output buffer 28 for data stream b.

Thus, there is a saving in the amount of memory required in that the de-interleaver output memory 14 of FIG. 1 can be omitted. There are also considerable time savings. First, rather than performing a de-interleaving operation and subsequently a de-multiplexing operation, a single transformation is applied to each data item in the received signal buffer 22. Second, there is now only a single memory read and a single memory write operation for each data item. In the prior art, there were extra delays associated with writing de-interleaved data into memory 14 and reading data from this memory for de-multiplexing. These memory access time delays are now avoided.

It will be appreciated that the number of multiplexed data streams a, b and the number of bits shown in the memories described are arbitrary and may be varied. In addition, the application of the invention to a transmitter which multiplexes and then interleaves data streams will be clear to persons skilled in this art. For example, in FIG. 2, the process flow arrows could be reversed. Buffers 26 and 28 then become input buffers for buffering the data streams to be multiplexed by processor 24, which also interleaves the data items. The interleaved, multiplexed data items are written into memory 22, which becomes an output buffer from which the interleaved and multiplexed data stream can be provided to, ultimately, a transmitter antennae.

What is claimed is:

1. A method of recovering separate data from a composite data stream, in which method the order of the data in each separate recovered stream is different to the order in which that data appears in the composite stream, said method comprising: performing a single convolutional operation on each data item in the composite data stream to assign the data item to the correct position in the appropriate one of the recovered data streams, the re-ordering comprising de-interleaving, and the assigning of the data item to the appropriate data stream comprising de-multiplexing, provided that the method does not include buffering the data items between de-interleaving and de-multiplexing.

2. A method of producing a composite data stream from separate data streams, in which method the order of the data in each separate stream is different to the order in which that data appears in the composite stream, said method comprising: performing a single convolutional operation on each data item in each of the separate data streams to assign the data item to the appropriate position in the composite data stream, the re-ordering comprising interleaving, and the assigning of each data item to the composite data stream comprising multiplexing, provided that the method does not include buffering the data items between interleaving and multiplexing.

3. An apparatus arranged to recover separate data streams from a composite data stream such that the order of the data in separate recovered stream is different to the order in which that data appears in the composite stream, said apparatus comprising: a data manipulator for performing a single convolutional operation on each data item in the composite data stream to assign the data item to the correct position in the appropriate one of the recovered separate data streams, the data manipulator including a de-interleaver for re-ordering the data items, and a de-multiplexer for assigning the data items to the appropriate data stream, provided that the apparatus does not include a memory arranged to buffer the data items between the de-interleaver and the de-multiplexer.

4. An apparatus arranged to produce a composite data stream from separate data streams such that the order of the data in each separate stream is different to the order in which that data appears in the composite stream, said apparatus comprising: a data manipulator for performing a single convolutional operation on each data item in each of the separate data streams to assign the data item to the appropriate position in the composite data stream, the data manipulator including an interleaver for re-ordering the data items, and a multiplexer for assigning the data items to the composite data stream, provided that the apparatus does not include a memory arranged to buffer the data items between the interleaver and the multiplexer.

5. A computer-readable medium containing computer-executable instructions for causing a data processing apparatus to recover separate streams of data from a composite data stream, in which recovery process the order of the data in each separate recovered stream is different to the order in which that data appears in the composite stream, the computer-executable instructions comprise performing a single convolutional operation on each data item in the composite data stream to assign the data item to the correct position in the appropriate one of the recovered data streams, the re-ordering comprising de-interleaving, and the assigning of the data item to the appropriate data stream comprising demultiplexing, provided that the method does not include buffering the data items between de-interleaving and demultiplexing.

6. A computer-readable medium containing computer-executable instructions for causing a data processing apparatus to produce a composite data stream from separate data streams, in which production process the order of the data in each separate stream is different to the order in which that data appears in the composite stream, the computer-executable instructions comprise performing a single convolutional operation on each data item in each of the separate streams to assign the data item to the appropriate position in the composite data stream, the re-ordering comprising interleaving, and the assigning of the data item to the composite data stream comprising multiplexing provided that the method does not include buffering the data items between interleaving and multiplexing.

7. The computer-readable medium of claim 6, wherein the reordering operation comprises interleaving.

8. The method as in claim 1 or 2, wherein the separate data streams are a stream of systematic data and two streams of parity information from two components.

9. A method according to any one of claim 3 or 4, wherein the separate data streams are a stream of systematic data and two streams of parity information from two component encoders.

* * * * *